United States Patent
Song et al.

(10) Patent No.: US 11,217,765 B2
(45) Date of Patent: Jan. 4, 2022

(54) DISPLAY SUBSTRATE, FABRICATING METHOD OF DISPLAY SUBSTRATE, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Li Song, Beijing (CN); Zhiliang Jiang, Beijing (CN); Ming Mao, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 30 days.

(21) Appl. No.: 16/456,966

(22) Filed: Jun. 28, 2019

(65) Prior Publication Data

US 2020/0220097 A1   Jul. 9, 2020

(30) Foreign Application Priority Data

Jan. 3, 2019  (CN) .......................... 201910005748.3

(51) Int. Cl.
*H01L 51/52* (2006.01)
*H01L 27/32* (2006.01)
(Continued)

(52) U.S. Cl.
CPC .......... *H01L 51/524* (2013.01); *G03F 7/0007* (2013.01); *H01L 27/3246* (2013.01);
(Continued)

(58) Field of Classification Search
CPC ... H01L 51/524; H01L 52/5253; H01L 27/32; H01L 27/3246; Y10T 428/24579; Y10T 428/24612; G03F 7/007
See application file for complete search history.

(56) References Cited

U.S. PATENT DOCUMENTS

| 2015/0048329 A1* | 2/2015 | Kim ...................... H01L 51/524 257/40 |
| 2017/0084883 A1 | 3/2017 | Kwon et al. |
| 2018/0102502 A1* | 4/2018 | Kim .................... H01L 27/3276 |

FOREIGN PATENT DOCUMENTS

| CN | 103811530 A | 5/2014 |
| CN | 104377223 A | 2/2015 |

(Continued)

OTHER PUBLICATIONS

First Office Action for CN Patent Application No. 201910005748.3 dated Aug. 4, 2020.

(Continued)

*Primary Examiner* — Catherine A. Simone
(74) *Attorney, Agent, or Firm* — Thomas | Horstemeyer, LLP

(57) ABSTRACT

The present disclosure relates to the field of display technologies, and relates to a display substrate, a fabricating method of a display substrate, and a display device. The display substrate includes a base. The display substrate is divided into a display area and a non-display area located at a periphery of the display area. The display area has a plurality of pixel regions. Each of pixel regions is provided with a pixel structure. The pixel structure includes a plurality of organic film layers and inorganic film layers disposed in a stacked manner. An area of the non-display area near an edge thereof is an anti-cracking reinforcing area, which is only provided with the organic film layer. The organic film layer at least covers an outer edge surface of the inorganic film layer adjacent to the anti-cracking reinforcing area in the non-display area.

13 Claims, 2 Drawing Sheets

(51) Int. Cl.
*G03F 7/00* (2006.01)
*H01L 51/56* (2006.01)
(52) U.S. Cl.
CPC .......... *H01L 51/5253* (2013.01); *H01L 51/56* (2013.01); *Y10T 428/24579* (2015.01); *Y10T 428/24612* (2015.01)

(56) References Cited

FOREIGN PATENT DOCUMENTS

| | | |
|---|---|---|
| CN | 105374947 A | 3/2016 |
| CN | 108110147 A | 6/2018 |
| CN | 108281570 A | 7/2018 |
| KR | 20140086637 A | 7/2014 |

OTHER PUBLICATIONS

Third Office Action for CN Patent Application No. 201910005748.3 dated Jul. 7, 2021.

\* cited by examiner

DISPLAY SUBSTRATE, FABRICATING METHOD OF DISPLAY SUBSTRATE, AND DISPLAY DEVICE

CROSS-REFERENCE TO RELATED APPLICATION

The present application is based on and claims the benefit of and priority to Chinese Patent Application No. 201910005748.3, filed on Jan. 3, 2019, the entire contents of which being incorporated herein by reference.

TECHNICAL FIELD

The present disclosure relates to the field of display technologies and, in particular, to a display substrate, a fabricating method of a display substrate, and a display device.

BACKGROUND

In a new generation of display devices, display modes, such as Organic Light Emitting Diode (OLED) and Quantum Dots Light Emitting Diode (QLED), have advantages of bright color, low power consumption, thin and flexible characteristics, and the like, which have become a current research hotspot. Organic light emitting devices and quantum dots light emitting devices are easily eroded and thus, are disabled by water and oxygen, and the light emitting material is generally treated by Thin Film Encapsulation (TFE) to insulate water and oxygen.

In the current production line, a plurality of display device areas are arranged on the display substrate, a predetermined number of pixel structures including control elements and light emitting devices are formed in each area, and finally, individual display devices are formed through a cutting process. The display device is easily cracked under external force, for example, force generated by collision, transportation, etc. Especially, in the process of cutting to form independent display devices, cracks are inevitably formed at a border of the display device, so that there is a huge impact on the performance of display device.

It can be seen that it has become a technical problem to be solved at present about how to provide the structure of the display substrate in the non-display area so as to improve the performance of the display device.

SUMMARY

The technical problem to be solved by the present disclosure is to provide a display substrate, a fabricating method of a display substrate, and a display device with respect to the above-mentioned defects in the related art, which can effectively improve the performance of the display device by providing the arrangement structure of the organic film layers of the display substrate in the non-display area.

In a technical solution adopted to solve the technical problem of the present disclosure, a display substrate may be provided, including:
 a base;
 at least one organic film layer at a side of the base;
 wherein the base comprises a display area, a non-display area located at at least one side of the display area, and an anti-cracking reinforcing area located at an edge of the non-display area away from the display area; and the anti-cracking area is only provided with the at least one organic film layer configured to block cracks from diffusing towards the display area.

Optionally, the display substrate further comprises a blocking dam located on the same side of the base, and the at least one organic film layer is further away from the display area relative to the blocking dam.

Optionally, an interval between the anti-cracking reinforcing area and the blocking dam may be greater than or equal to 100 μm.

Optionally, the at least one organic film layer extends to the blocking dam or, there is a gap domain between the at least one organic film layer and the blocking dam, and an outermost layer of the gap domain is an inorganic film layer Optionally, the display substrate further comprises a planarization layer located on the base and a pixel define layer located at a side of the planarization layer away from the base; the planarization layer is configured to flatten a surface of the base, and the pixel defining layer is configured to define a light emitting area; and a material of the at least one organic film layer is the same as that of the planarization layer and the pixel define layer.

Optionally, the at least one organic film layer comprises two organic film layers, materials of which are the same as the material of the planarization layer and the material of the pixel define layer, respectively.

Optionally, the base includes a first bottom layer, a second bottom layer, and a bottom barrier between the first bottom layer and the second bottom layer;
 the first bottom layer and the second bottom layer are formed of organic material including polyimide; and
 the bottom barrier is formed of inorganic insulating material, which is correspondingly removed from the anti-cracking reinforcing area.

Optionally, the display substrate further comprises a package thin film located at a side of the blocking dam away from the base, the package thin film covering the blocking dam and cut off at an inner edge of the anti-cracking reinforcing area near the display area.

Optionally, a total thickness of the at least one organic film layer of the anti-cracking reinforcing area is greater than a sum of thicknesses of inorganic film layers and organic film layers adjacent to the anti-cracking reinforcing area in the non-display area.

A fabricating method of a display substrate is provided. The display substrate comprises a base, a display area, and a non-display area located at at least one side of the display area, wherein the fabricating method comprises the steps of:
 forming an area located at an edge of the non-display area away from the display area as an anti-cracking reinforcing area;
 retaining an organic material of at least one organic film layer at the anti-cracking reinforcing area correspondingly while forming organic film layers in the display area by a patterning process, so that the organic film layer at least covers an outer edge surface of an inorganic film layer adjacent to the anti-cracking reinforcing area in the non-display area; and
 removing an inorganic material corresponding to inorganic film layers from the anti-cracking reinforcing area when any of the inorganic film layers are formed in the display area.

Optionally, the fabricating process of forming the organic film layers in the display area and the anti-cracking reinforcing area by using the patterning process includes:
 forming an organic material film on the base by using organic material;

performing an exposure process on the organic material film by using a mask plate in which a pattern of the mask plate is provided such that a device pattern corresponding to the display area, and the anti-cracking reinforcing area are formed as an organic material retention areas;

removing the organic material of the organic material film except for a portion thereof in the organic material retention area through a developing process.

Optionally, thicknesses of organic film layers of the display area and the anti-cracking reinforcing area formed in the same patterning process are equal;

or, thicknesses of organic film layers of the display area and the anti-cracking reinforcing area formed in the same patterning process are different.

Optionally, the display substrate further comprises a planarization layer located on the base and a pixel define layer located at a side of the planarization layer away from the base; the planarization layer is configured to flatten a surface of the base, and the pixel defining layer is configured to define a light emitting area;

a material of the at least one organic film layer is the same as that of the planarization layer and the pixel define layer.

Optionally, the at least one organic film layer comprises two organic film layers, materials of which being the same as the material of the planarization layer and the material of the pixel define layer, respectively.

Optionally, a total thickness of the organic film layers of the anti-cracking reinforcing area is greater than a sum of thicknesses of at least one inorganic film layer and organic film layers adjacent to the anti-cracking reinforcing area in the non-display area.

A display device including the above-mentioned display substrate is provided.

DETAILED DESCRIPTION

In order to enable those skilled in the art to better understand the technical solution of the present disclosure, the display substrate, the fabricating method of the display substrate, and the display device according to the present disclosure will be further described in detail below with reference to the accompanying drawings and specific embodiments.

The technical idea of the present disclosure is that, during the formation of the display substrate, a control element, light emitting device, and a combination structure therebetween (to some extent, also as a part of the control element and the light emitting device) in the display substrate are formed of various organic materials and inorganic materials treated in sequence by various processes, such as film formation and patterning-and-stacked. The organic material absorbs energy due to its easy deformation and thus, cracks are less likely to be formed whereas the inorganic material is more prone to cracking than the organic material. Based on the technical idea, the present disclosure provides a display substrate and a fabricating method of the display substrate, where only an organic film layer is retained in part of the non-display area, thereby preventing the inorganic film layer from being cracked by external forces from a source. Also, cracks are blocked or prohibited from being transmitted to the display area thus, effectively improving the impact resistance of the display substrate.

In view of the current situation where the non-display area is prone to cracking and cracks are transmitted to the display area to affect the display performance of the display area, an embodiment of the present disclosure provides a display substrate having better impact resistance and thus, the embodiments described herein relate to effectively improving the overall performance of the display substrate to obtain a better display effect.

Figure 1:
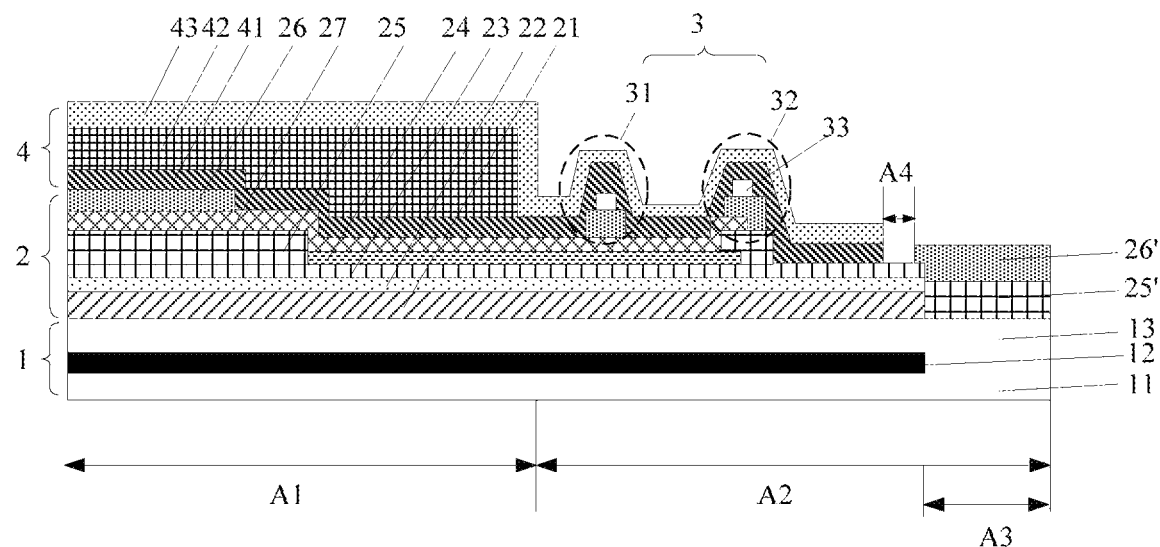
FIG. 1 is a partial schematic structural view of a display substrate in an embodiment of the present disclosure.

As shown in FIG. 1, the display substrate includes a base 1 and is divided into a display area A1 and a non-display area A2 located at an outside of the display area A1. The display area A1 has a plurality of pixel regions, and each pixel region is provided with a pixel structure 2 (only a portion of the pixel structure 2 near the non-display area A2 is shown in FIG. 1). The pixel structure 2 includes a plurality of organic film layers and inorganic film layers disposed in a stacked manner, and an area of the non-display area A2 near an edge thereof is an anti-cracking reinforcing area A3. The anti-cracking reinforcing area A3 is only provided with the organic film layer, and the organic film layer at least covers an outer edge surface of the inorganic film layer adjacent to the anti-cracking reinforcing area A3 in the non-display area A2. On one hand, the organic film layer can absorb energy by deformation and is less prone to cracking. On the other hand, by providing the anti-cracking reinforcing area A3 including only the organic film layer, in view of the blocking effect of the organic film layer on crack transmission, the crack transmission from the non-display area A2 to the display area A1 can be effectively eliminated.

In FIG. 1, a blocking dam 3 is further provided in the non-display area A2, and the anti-cracking reinforcing area A3 is further away from the display area A1 with respect to the blocking dam 3. By defining a position of the anti-cracking reinforcing area A3 by the blocking dam 3, only the edge of the non-display area A2 can be improved in actual implementation without affecting other performances of the display substrate including the display effect.

Optionally, a distance between the anti-cracking reinforcing area A3 and the blocking dam 3 is greater than or equal to 100 μm. The anti-cracking reinforcing area A3 is disposed outside the blocking dam 3, and the position of the anti-cracking reinforcing area A3 relative to the blocking dam 3 is defined, ensuring that only the edge of the non-display area A2 is improved without affecting other performances of the display substrate including the display effect.

Figure 2:
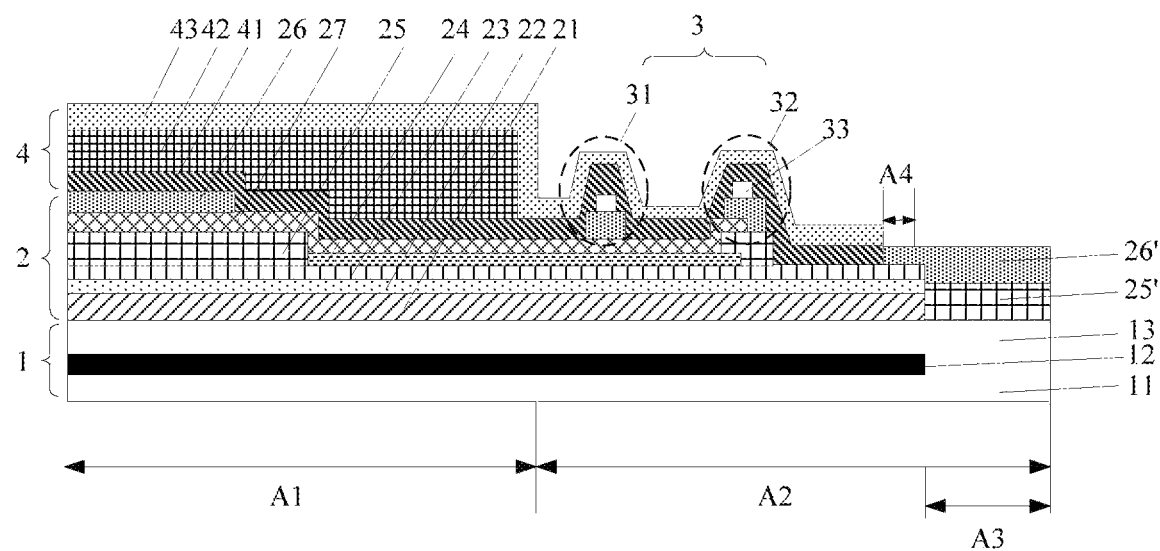
FIG. 2 is another partial schematic structural view of a display substrate in an embodiment of the present disclosure.

In FIG. 1, there is a gap domain A4 between the anti-cracking reinforcing area A3 and the blocking dam 3, and an outermost layer of the gap domain A4 is an inorganic film layer. Alternatively, as shown in FIG. 2, the organic film layer of the anti-cracking reinforcing area A3 may extend to the blocking dam 3. There may be a gap or no gap provided between the anti-cracking reinforcing area A3 and the blocking dam 3, thus, reducing the process requirements and ensuring the yield.

The pixel structure 2 includes a control element and a light emitting device. The control element at least includes a planarization layer 25, and the light emitting device at least includes a pixel define layer 26. The anti-cracking reinforcing area A3 is only provided with the planarization layer 25 and/or the pixel define layer 26. Alternatively, the planarization layer 25 and the pixel define layer 26 are regarded as a combination structure between the control element and the light emitting device. In this case, the planarization layer 25 and the pixel define layer 26 are located above the control element and below the light emitting device, and the planarization layer 25 is used to flatten a combination surface between the control element and the light emitting device, facilitating the arrangement of the light emitting device. The pixel define layer 26 is used to define the arrangement range of the respective film layer constituting the light emitting device. The film layer of the anti-cracking reinforcing area A3 actually corresponds to the film layer of the display area A1 on the plane perpendicular to the base 1, so that the structure of the anti-cracking reinforcing area A3 and film layers of the pixel structure 2 of the display area A1 are formed in the same patterning process to simplify the process flow.

Optionally, the light emitting device is an organic light emitting device or a quantum dots light emitting device. That is to say, the display substrate in the present embodiment may be applied to a structure of an organic light-emitting device or a quantum dots light-emitting device as the pixel structure 2, so as to achieve various purposes.

In FIG. 1, the base 1 includes a first bottom layer 11, a second bottom layer 13, and a bottom barrier 12 between the first bottom layer 11 and the second bottom layer 13. The first bottom layer 11 and the second bottom layer 13 are formed of organic material including polyimide. The bottom barrier 12 is formed of inorganic insulating material, which is correspondingly removed from the anti-cracking reinforcing area A3. The bottom barrier 12 can prevent external static electricity from affecting the internal circuit. It can be easily understood that the base 1 as the overall support of the display substrate not only provides support for both the display area A1 and the non-display area A2, but also enhances, rather than reduces, the performance of the anti-cracking reinforcing area A3.

Optionally, a total thickness of organic film layers of the anti-cracking reinforcing area A3 is greater than a sum of thicknesses of inorganic film layers and organic film layers adjacent to the anti-cracking reinforcing area A3 in the non-display area A2. Under such a thickness condition, the organic film layers of the anti-cracking reinforcing area A3 can completely cover the inorganic film layers, ensuring the requirement of the water-oxygen sealing of the light-emitting device.

In FIG. 1, a package thin film 4 (TFE) is disposed at a side of the pixel structure 2 away from the base 1. The package thin film 4 covers the blocking dam 3 (for example, a first blocking dam 31 and a second blocking dam 32 are included in FIG. 1) and is cut off at the inner edge of the anti-cracking reinforcing area A3 adjacent to the display area A1. In FIG. 1, the blocking dam 3 extends from the pixel define layer 26 of the display area A1 to the non-display area and is formed together with a spacer 33. Through a combination of the package thin film 4 and the blocking dam 3, and according to the position arrangement of the above-mentioned package thin film and blocking dam and the anti-cracking reinforcing area A3, requirements of water-oxygen sealing of the light-emitting device can be more effectively ensured.

The partial structure of the display substrate shown in FIG. 1 further includes: a barrier 21, a buffer 22, a gate insulating (GI) 23, an interlayer dielectric (ILD) 24, a first organic film layer 41, and a second organic film layer 43 of the package thin film 4, which are formed of inorganic material; a planarization layer 25 (PLN) and a pixel define layer 26 (PDL) formed of organic material; and an anode 27 formed of metal material. The planarization layer 25' and the pixel define layer 26' extending from the same layer of the display area A1 are covered with the anti-cracking reinforcing area A3, so that only the organic film layer exists at the border of the non-display area.

In the related art, in order to solve the crack problem, only a form of a crack dam can be used to prevent cracks in the edge inorganic film layer from diffusing toward the display area A1. That is, a groove is formed in the gate insulating 23 (GI) and the interlayer dielectric 24 (ILD) at the edge of the display substrate to form a crack dam, and an interface of the crack dam is used to block expansion of the crack. However, the crack dam cannot prevent generation of cracks in the edge inorganic film layer. The edge inorganic film layer may still generate cracks after the impact collision, and then water and oxygen penetrates through the cracks, resulting in formation of GDS (Growing Dark Spot), seriously damaging the product performance and shortening the service life of the product.

Compared with the display substrate in the related art, the display substrate of the present application removes the crack dam in the current border design, and removes all the inorganic film layers outside the blocking dam located at the relatively outer side to retain only the organic film layer. In this case, only the organic film layer is present at the border of the display substrate, so that:

the inorganic film layer can be prevented from being cracked by the external force from the source, and the crack can be prevented from being transmitted to the display area, thereby effectively improving the impact resistance of the display substrate;

the border distance can be significantly shortened to achieve narrow borders and ultra-narrow borders;

in addition, since the structure can ensure the uniform stacking of edge-cut film layers, especially at the corner of the pad bending of the circuit board, cracks caused by the inconsistency of the film structure during cutting can be prevented; and on the cutting line are all organic film layers, the cutting energy of the laser can be effectively reduced and the cutting yield and quality can be improved.

It can be seen that the display substrate is provided with an anti-cracking reinforcing area at the area of the non-display area adjacent to the edge thereof, and is only provided with the organic film layer at the anti-cracking reinforcing area so that the inorganic film layer can be prevented from being cracked by external force, and transmission of cracks can be eliminated from the source. It has a significant effect on narrowing the border, improving the impact resistance of the display substrate, saving energy, improving the cutting yield and effect, effectively improving the performance of the display product, and prolonging the service life of the display product.

Another embodiment of the present disclosure provides a fabricating method of a display substrate that can be used to form the display substrate of the previous embodiment. As described above, the display substrate includes a base 1 and is divided into a display area A1 and a non-display area A2 located at an outside of the display area A1. The display area A1 has a plurality of pixel regions, and each pixel region is provided with a pixel structure 2. The pixel structure 2 includes a plurality of organic film layers and inorganic film layers disposed in a stacked manner.

Figure 3:
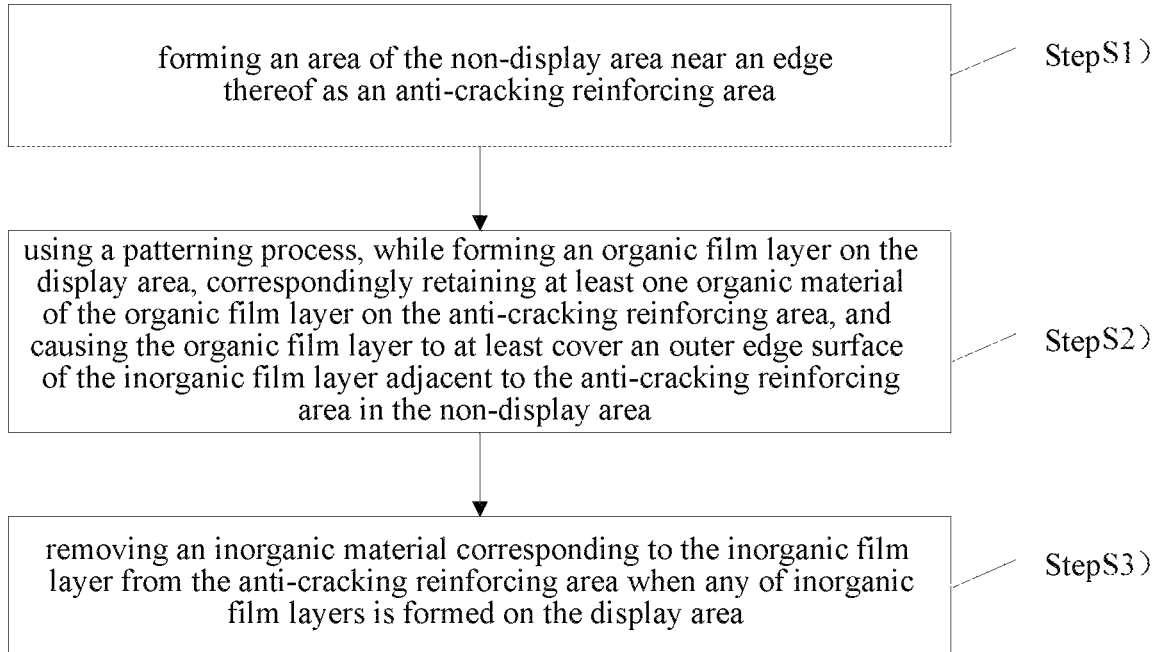
FIG. 3 is a flow chart of a fabricating method of a display substrate in another embodiment of the present disclosure.

As shown in FIG. 3, the fabricating method of the display substrate includes the steps of:

Step S1): forming an area of the non-display area A2 near an edge thereof as an anti-cracking reinforcing area A3.

In this step, the pixel structure 2 includes a control element and a light-emitting device. According to the anti-cracking reinforcing area A3, a film layer pattern of the control element and the light-emitting device corresponding to the area is pre-planned, and a pattern of a mask plate is correspondingly designed.

Step S2): using a patterning process, while forming an organic film layer on the display area A1, correspondingly retaining at least one organic material of the organic film layer on the anti-cracking reinforcing area A3, and causing the organic film layer to at least cover an outer edge surface of the inorganic film layer adjacent to the anti-cracking reinforcing area A3 in the non-display area A2.

Figure 4:
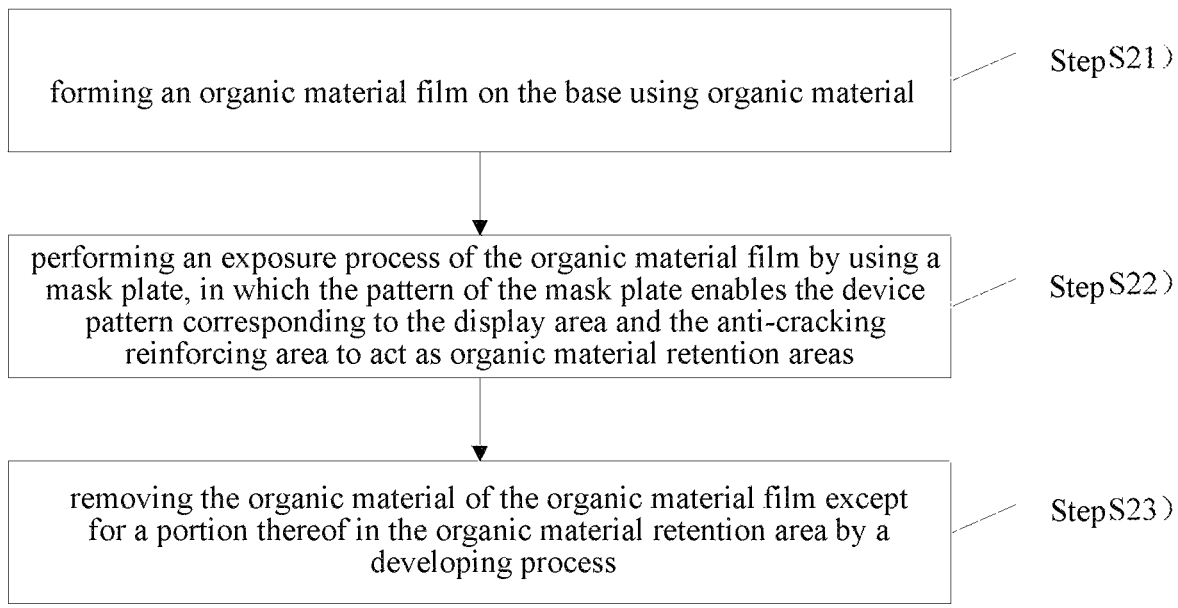
FIG. 4 is a specific flow chart of step S2) of FIG. 3.

In this step, as shown in FIG. 4, the fabricating process of forming an organic film layer on the display area A1 and the anti-cracking reinforcing area A3 by the patterning process includes:

Step S21): forming an organic material film on the base 1 using organic material.

Step S22): performing an exposure process of the organic material film using a mask plate in which the pattern of the mask plate enables the device pattern corresponding to the display area A1 and the anti-cracking reinforcing area A3 to act as organic material retention areas.

Step S23): removing the organic material of the organic material film except for a portion thereof in the organic material retention area through a developing process.

Step S3): removing an inorganic material corresponding to the inorganic film layer from the anti-cracking reinforcing area A3 when any of inorganic film layers is formed on the display area A1.

The film layer structure of the anti-cracking reinforcing area A3 substantially corresponds to a specific film layer of the display area A1 and thus, can be formed in the same patterning process to simplify the fabricating process. The control element at least includes a planarization layer 25, and the light emitting device at least includes a pixel define layer 26. The planarization layer 25 and the pixel define layer 26 are all formed of organic material, and only the planarization layer 25 and/or the pixel define layer 26 are formed in the anti-cracking reinforcing area A3.

The partial structure of the display substrate shown in FIG. 1 further includes: a barrier 21, a buffer 22, a gate insulating (GI) 23, an interlayer dielectric (ILD) 24 and a first organic film layer 41 and a second organic film layer 43 of the package thin film 4, which are formed of inorganic material. These film layer structures can be removed by the patterning process including exposure, development, and etching. The planarization layer 25' and the pixel define layer 26' extending from the same layer of the display area A1 are covered by the anti-cracking reinforcing area A3, so that only the organic film layers exist at the border.

That is, with respect to the portion of the anti-cracking reinforcing portion A3 of each film layer, the material forming the film layer is removed or retained according to whether the material is the organic material or the inorganic material, through the steps S2) and S3). Thus, all the inorganic film layers other than the second blocking dam 32 are etched away. Preferably, removal of the inorganic film layer starts from a distance greater than or equal to 100 μm outside the second blocking dam 32. The distance mainly considers an opening of the inorganic film layer in the thin film package structure, and the inorganic film layer is etched starting from the outside of the opening of the mask plate to ensure package effectiveness while protecting data lines and the anode.

Optionally, a total thickness of organic film layers of the anti-cracking reinforcing area A3 is greater than a sum of thicknesses of inorganic film layers and organic film layers adjacent to the anti-cracking reinforcing area A3 in the non-display area A2. Under such thickness, the organic film layer of the anti-cracking reinforcing area A3 can completely cover the inorganic film layer, ensuring the requirement of the water-oxygen sealing of the display substrate.

Forming the organic film layer of the anti-cracking reinforcing area A3 in the same patterning process can greatly simplify the process flow. When forming the organic film layer of the display area A1 and the anti-cracking reinforcing area A3, a common mask plate may be used, so that thicknesses of the organic film layers of the display area A1 and the anti-cracking reinforcing area A3 formed in the same patterning process are equal; or alternatively, for example, the halftone mask plate or the gray tone mask plate may be used, so that thicknesses of the organic film layers of the display area A1 and the anti-cracking reinforcing area A3 formed in the same patterning process are different. Thus, thicknesses of the organic film layer of the anti-cracking reinforcing area A3 and the organic film layer of the display area A1 can be flexibly adjusted under the condition of ensuring the sealing requirement.

It can be seen that the fabricating method of the display substrate, in which an anti-cracking reinforcing area is disposed at the area of the non-display area adjacent to the edge thereof and only the organic film layer is disposed at the anti-cracking reinforcing area, can prevent the inorganic film layer from being cracked by external force and transmission of cracks can be eliminated from the source. It has a significant effect on narrowing the border, improving the impact resistance of the display substrate, saving energy, improving the cutting yield and effect, effectively improving the performance of the display product, and prolonging the service life of the display product.

Yet another embodiment of the present disclosure provides a display device including the display substrate of the previous embodiment.

The display device may be: a desktop computer, a tablet computer, a notebook computer, a mobile phone, a PDA, a GPS, a car display, a projection display, a camera, a digital camera, an electronic watch, a calculator, an electronic instrument, a meter, a LCD panel, an electronic paper, a television, a display, a digital photo frame, a navigator and other products or components having display function, and can be applied to various fields such as public display and unreal display.

The display device can obtain a better display effect.

The beneficial effects of the present disclosure are:

The display substrate and its corresponding fabricating method, in which an anti-cracking reinforcing area is disposed at the area of the non-display area adjacent to the edge thereof and only the organic film layer is disposed at the anti-cracking reinforcing area, can prevent the inorganic film layer from being cracked by external force and transmission of cracks can be eliminated from the source. This has a significant effect on narrowing the border, improving the impact resistance of the display substrate, saving energy, improving the cutting yield and effect, effectively improving the performance of the display product, and prolonging the service life of the display product.

Thus, the display device using the display substrate can obtain a better display effect.

It should be understood that the above embodiments are merely example embodiments employed to explain the principles of the present disclosure, but the present disclosure is not limited thereto. Various modifications and improvements can be made by those skilled in the art without departing from the spirit and scope of the present disclosure, and such modifications and improvements are also considered to be within the scope of the present disclosure.

What is claimed is:

1. A display substrate, comprising:
a base; and
at least one organic film layer at a side of the base; and
a blocking dam, wherein:
the base comprises a display area, a non-display area on at least one side of the display area, and an anti-cracking reinforcing area at an edge of the non-display area away from the display area;
at least one organic film layer is in the anti-cracking reinforcing area, the at least one organic film layer being configured to block cracks from diffusing towards the display area;
the blocking dam and the at least one organic film layer are on the same side of the base;
the at least one organic film layer is further away from the display area relative to the blocking dam;
the base comprises a first bottom layer, a second bottom layer, and a bottom barrier between the first bottom layer and the second bottom layer;
the first bottom layer and the second bottom layer are formed of organic material comprising polyimide; and
the bottom barrier is formed of inorganic insulating material, which is correspondingly removed from the anti-cracking reinforcing area.

2. The display substrate according to claim 1, wherein, in the anti-cracking reinforcing area, the base is only provided with the at least one organic film layer at the side of the base.

3. The display substrate according to claim 1, wherein an interval between the anti-cracking reinforcing area and the blocking dam is greater than or equal to 100 μm.

4. The display substrate according to claim 1, wherein the at least one organic film layer extends to the blocking dam.

5. The display substrate according to claim 1, wherein a gap domain exists between the at least one organic film layer and the blocking dam, and an outermost layer of the gap domain is an inorganic film layer.

6. The display substrate according to claim 1, wherein the display substrate further comprises:
a planarization layer located on the base and a pixel define layer located at a side of the planarization layer away from the base;
wherein the planarization layer is configured to flatten a surface of the base, and the pixel defining layer is configured to define a light emitting area; and
wherein a material of the at least one organic film layer is the same as that of the planarization layer and the pixel define layer.

7. The display substrate according to claim 6, wherein:
the at least one organic film layer comprises two organic film layers; and
materials of the two organic film layers are the same as a material of the planarization layer and a material of the pixel define layer, respectively.

8. The display substrate according to claim 1, wherein the display substrate further comprises a package thin film located at a side of the blocking dam away from the base, the package thin film covering the blocking dam and cut off at an inner edge of the anti-cracking reinforcing area near the display area.

9. The display substrate according to claim 1, wherein a total thickness of the at least one organic film layer of the anti-cracking reinforcing area is greater than a sum of thicknesses of inorganic film layers and organic film layers adjacent to the anti-cracking reinforcing area in the non-display area.

10. A display device, comprising:
a display substrate, comprising:
a base;
at least one organic film layer at a side of the base; and
a blocking dam, wherein:
the base comprises a display area, a non-display area on at least one side of the display area, and an anti-cracking reinforcing area at an edge of the non-display area away from the display area;
at least one organic film layer is in the anti-cracking reinforcing area, the at least one organic film layer being configured to block cracks from diffusing towards the display area;
the blocking dam and the at least one organic film layer are on the same side of the base;
the at least one organic film layer is further away from the display area relative to the blocking dam;
the base comprises a first bottom layer, a second bottom layer, and a bottom barrier between the first bottom layer and the second bottom layer;
the first bottom layer and the second bottom layer are formed of organic material comprising polyimide; and
the bottom barrier is formed of inorganic insulating material, which is correspondingly removed from the anti-cracking reinforcing area.

11. The display device according to claim 10, wherein:
in the anti-cracking reinforcing area, the base is only provided with the at least one organic film layer at the side of the base;
an interval between the anti-cracking reinforcing area and the blocking dam is greater than or equal to 100 μm;
the at least one organic film layer extends to the blocking dam; and
a gap domain exists between the at least one organic film layer and the blocking dam, and an outermost layer of the gap domain is an inorganic film layer.

12. The display device according to claim 10, wherein:
the display substrate further comprises a planarization layer located on the base and a pixel define layer located at a side of the planarization layer away from the base;
the planarization layer is configured to flatten a surface of the base, and the pixel defining layer is configured to define a light emitting area;
a material of the at least one organic film layer is the same as that of the planarization layer and the pixel define layer;
the at least one organic film layer comprises two organic film layers; and
materials of the two organic film layers are the same as a material of the planarization layer and a material of the pixel define layer, respectively.

13. The display device according to claim 10, wherein the display substrate further comprises a package thin film located at a side of the blocking dam away from the base, the package thin film covering the blocking dam and cut off at an inner edge of the anti-cracking reinforcing area near the display area.

* * * * *